US011486234B2

(12) United States Patent
MacGillivray

(10) Patent No.: US 11,486,234 B2
(45) Date of Patent: Nov. 1, 2022

(54) DETONATOR MODULE

(71) Applicant: Halliburton Energy Services, Inc., Houston, TX (US)

(72) Inventor: Joseph T. MacGillivray, Fort Worth, TX (US)

(73) Assignee: Halliburton Energy Services, Inc., Houston, TX (US)

(*) Notice: Subject to any disclaimer, the term of this patent is extended or adjusted under 35 U.S.C. 154(b) by 356 days.

(21) Appl. No.: 16/752,534

(22) Filed: Jan. 24, 2020

(65) Prior Publication Data
US 2021/0230986 A1 Jul. 29, 2021

(51) Int. Cl.
| E21B 43/1185 | (2006.01) |
| H05K 5/02 | (2006.01) |
| H05K 5/00 | (2006.01) |
| E21B 43/117 | (2006.01) |
| H05K 1/14 | (2006.01) |
| H05K 1/11 | (2006.01) |
| H05K 1/02 | (2006.01) |

(52) U.S. Cl.
CPC ........ *E21B 43/1185* (2013.01); *E21B 43/117* (2013.01); *H05K 1/0216* (2013.01); *H05K 1/0259* (2013.01); *H05K 1/115* (2013.01); *H05K 1/14* (2013.01); *H05K 5/0026* (2013.01); *H05K 5/0247* (2013.01)

(58) Field of Classification Search
CPC . E21B 43/1185; E21B 43/117; H05K 1/0216; H05K 1/0259; H05K 1/115; H05K 1/14; H05K 5/0026; H05K 5/0247; F42D 1/045; F42D 3/00
See application file for complete search history.

(56) References Cited

U.S. PATENT DOCUMENTS

| 8,770,301 | B2 * | 7/2014 | Bell .................... E21B 43/1185 166/55 |
| 9,581,422 | B2 | 2/2017 | Preiss et al. |
| 10,273,788 | B2 | 4/2019 | Bradley et al. |
| 10,408,024 | B2 | 9/2019 | Hardesty |
| 11,091,987 | B1 * | 8/2021 | Benker .............. E21B 43/1185 |

(Continued)

FOREIGN PATENT DOCUMENTS

WO  0020820 A2  4/2000

OTHER PUBLICATIONS

International Search Report & Written Opinion in PCT/US2020/016374 dated Oct. 22, 2020.

*Primary Examiner* — Yong-Suk (Philip) Ro
(74) *Attorney, Agent, or Firm* — McGuire Woods LLP

(57) ABSTRACT

A detonator module provides for the use of a wide range of different addressable switches for use in perforating guns. The detonator module permits pre-assembly of a desired addressable switch and conforms the electrical connectivity to a particular perforating gun. In this manner, nearly any addressable switch can be used from any manufacturer despite having different sizes or wiring layouts. The pre-assembled detonator module can be safely shipped due to a safety shunt that can be removed on site prior to installation into a perforating gun. In one sense, the detonator module permits conformance of multiple different types of addressable switches to a particular type or model of perforating gun, permitting flexible choice of addressable switch for a particular project.

20 Claims, 7 Drawing Sheets

(56) References Cited

U.S. PATENT DOCUMENTS

| | | |
|---|---|---|
| 2010/0252323 A1 | 10/2010 | Goodman et al. |
| 2012/0255842 A1 | 10/2012 | Runkel |
| 2018/0299239 A1* | 10/2018 | Eitschberger ........... F42D 1/045 |
| 2020/0018584 A1 | 1/2020 | Phelps et al. |

* cited by examiner

DETONATOR MODULE

TECHNICAL FIELD

This disclosure relates, in general, to equipment utilized in conjunction with operations performed in subterranean hydrocarbon production including injection wells and, in particular, to a detonator module for use with a wide array of different detonators employed in perforating guns deployed in downhole operations.

BACKGROUND

Without limiting the scope of the present disclosure, its background will be described with reference to perforating guns and addressable switches that is used for producing fluid from a hydrocarbon bearing subterranean formation, as an example.

During the completion of a well that traverses a hydrocarbon bearing subterranean formation, perforating guns or strings of perforating guns are commonly used to facilitate extracting energy resources from the subterranean formation. Perforating guns may be lowered into a well to cause and control subterranean explosions to horizontally broaden vertical wellbores or broaden horizontal wellbores. Perforating guns may be strung together to create a string of perforating guns, as is known in the art.

Often addressable switches are used in a perforator gun assembly to cause detonation of explosives in the perforating gun, once placed at a desired location within a wellbore. The switches are typically installed on-site and wired into the perforating guns, which can be a timely task, with some risk of improper wiring that could lead to misfiring after the perforating guns have been lowered into a well. There are many different types of addressable switches available from different manufacturers of addressable switches, as is commonly known. The differences may include, but not limited to, different signaling or addressing schemes, different physical sizes, different orientation of electrical connections, and different wiring arrangements. A common example of an addressable switch is configured with five wires.

When a drilling project is planned, a particular type of addressable switch may be specified, as an example, from a particular manufacturer. In some situations, the specified addressable switch may be operable with only certain models or manufacturers of perforating guns due to physical or configuration limitations associated with the perforating gun.

BRIEF DESCRIPTION OF THE DRAWINGS

For a more complete understanding of the features and advantage of the present disclosure, reference is now made to the detailed description along with the accompanying figures in which corresponding numerals in the different figures refer to corresponding parts and in which.

DETAILED DESCRIPTION

Figure 1:
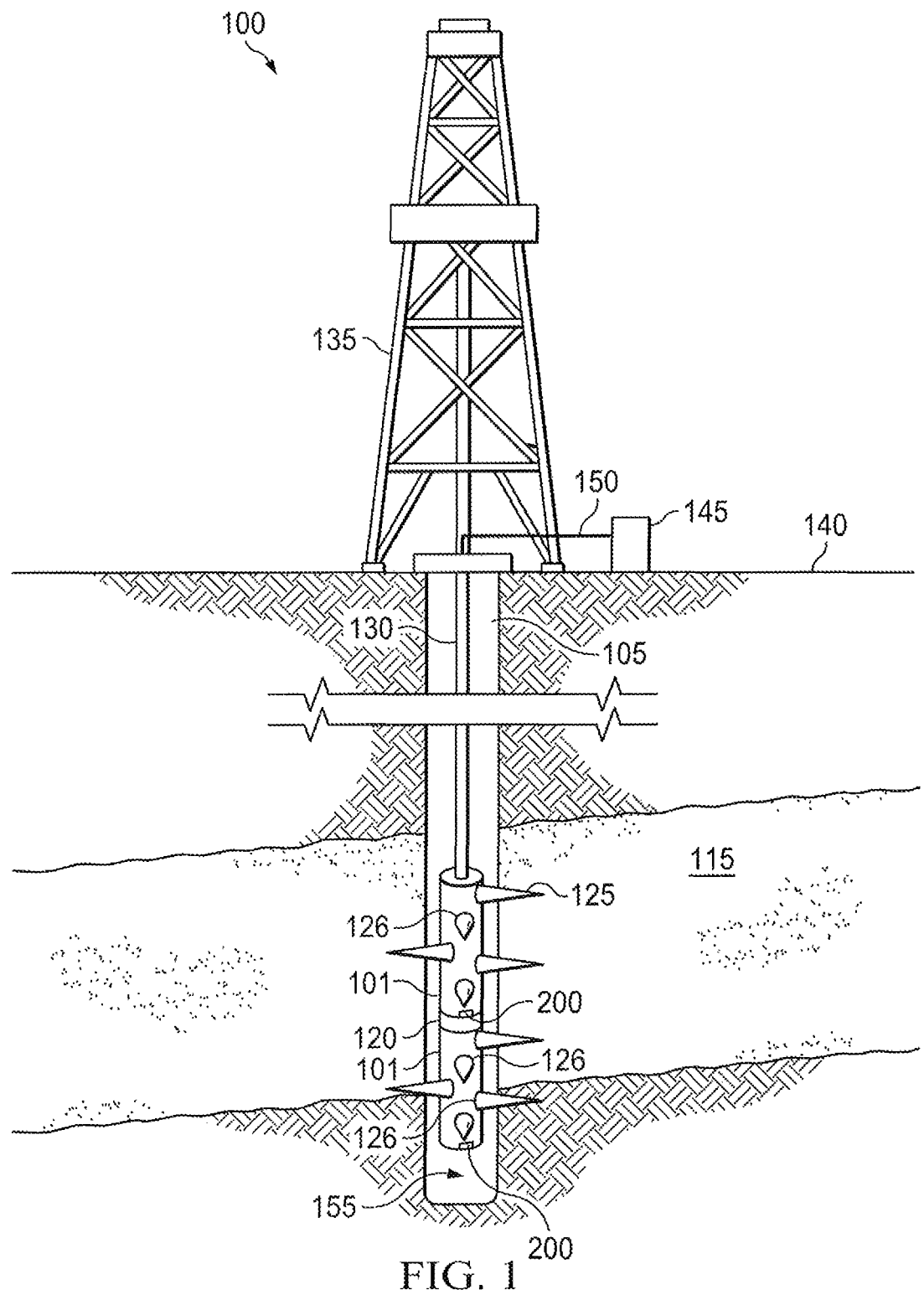
FIG. 1 an illustration of an example of a well completion using a string of perforating guns, which may employ various principles of the present disclosure.

While apparatuses, methods and embodiments are discussed in detail below, it should be appreciated that the present disclosure provides many applicable inventive concepts, which can be embodied in a wide variety of specific contexts. The examples herein are illustrative and do not delimit the scope of the present disclosure.

A wellbore is a hole that is drilled in a subterranean formation to aid in the exploration and recovery of natural resources, including oil and gas. A wellbore may be drilled along any given path, which in some cases is along a nominally straight and/or vertical wellbore path, and in other cases may follow a deviated path, such as in the deliberate steering of a borehole as it is drilled along a tortuous path through a formation to reach a target formation. The terms uphole and downhole are generally understood in the art with regard to the path of the wellbore. For example, in the absolute sense, uphole may refer to a location at or near the surface of a well site where drilling of the wellbore begins, and downhole may refer to a location within the drilled wellbore below the surface of the well site. In the relative sense, the terms uphole may refer to a direction toward or a position along the path of the wellbore nearer the beginning of the wellbore, and downhole may refer to a direction toward or a position further along the path of the wellbore.

A perforating gun is a device used downhole to perforate oil and gas wells in preparation for production by detonating shaped charges contained within the perforating gun, usually at a predetermined location within the wellbore. A string of perforating guns may be deployed downhole and may comprise any number of perforating guns, often separated from one another within the wellbore at different locations. The string of perforating guns and shaped charges therein can be activated in a sequence as desired. The detonation of the perforating guns can be controlled from the surface by communicating with addressable switches installed within each of the perforating guns to cause the shaped charges to detonate. Each addressable switch can be electronically addressed from the surface by an unique identifier associated with each switch.

The present disclosure provides, in part, a detonator module that includes a housing assembly flexibly constructed to accept a greater number and/or variety of different addressable switches, thereby permitting nearly any addressable switch to be used in a well completion project. The ability to use nearly any switch allows for better pricing alternatives for a given project that can often lower detonator assembly costs by as much as 50%. For example, if a particular well completion project has a specification that calls for a particular type of switch to be used, then the detonator module described herein, permits that particular specified switch to be used with a particular perforating gun.

The detonator module, according to principles of this disclosure, has flexible characteristics that accept, adapt or transform electrical connections and size of an addressable switch to become compatible with a particular perforating gun that normally would be incompatible; or the detonator module permits an addressable switch to be pre-wired into the detonator module at a location other than a project site. For example, the wring may be accomplished by off-site personnel more familiar with the different switches, rather than being wired by on-site personnel, thereby improving wiring reliability generally. The pre-wired detonator module may then be safely shipped to a project site where a safety shunt is removed. The detonator module may then be simply inserted into the perforating gun at the job site, without any need of any on-site wiring of the addressable switch, improving safety and reliability. The detonator module may also permit a previously non-compatible switch to conform and become compatible with a perforating gun having predetermined compartments and electrical connectivity.

FIG. 1 is an illustration of an example well completion 100 using a string of perforating guns 101, which may employ various principles of the present disclosure. Each of the perforating guns 101 comprises a generally elongated cylindrical tube. Equipped with one or more shaped explosive charges 126, perforating guns typically are available in a range of sizes and configurations. The diameter of the perforating gun used is typically determined by the presence of wellbore restrictions or limitations imposed by the surface equipment. The string of perforating guns 101 is shown lowered in a wellbore 105, for example using a wireline 130 from a drilling rig 135 located at the surface 140. In this example, surface equipment comprising a control system 145 may be employed, which is electrically coupled via wireline 130 to provide power and communication downhole to addressable switches 210 (FIG. 2A) within each detonator module 200. One perforating gun may be connected to another perforating gun by a collar 120, or connected to one another directly. Additional strings of perforating guns can be employed in a given well completion. The detonator module and addressable switches will be described more fully herein.

The control system 145 may be used by technicians to address switches located in detonator modules 200 that have been installed within the perforating guns 101. Once the perforating guns are lowered to a desired depth, which in this example is near the bottom 155 of the wellbore 105, technicians may send commands via connection 150 to address one or more addressable switches 210 (FIG. 2A) in detonator modules 200, which in turn causes a detonator 230 (FIG. 2B) associated with each addressed switch to detonate. The detonator 230 in turn causes one or more shaped charges 126 within a specific perforating gun to detonate. The shaped charges 126 cause an explosive outward force 125 that creates fissures in subterranean formation 115. These fissures enhance hydrocarbons ability to flow more freely into the wellbore 105 for recovery. There may be several strings of perforating guns used in a particular well completion project. Each perforating gun may include an addressable switch within a detonator module 200 that controls detonation of explosive charges 126 within a particular perforating gun.

Frequently, a sequence of detonations may be accomplished in a string of performing guns 101 by addressing switches in a particular sequence. For example, one or more perforating guns positioned lower downhole may be fired first, followed by perforating guns located more uphole which still would have electrical connectivity to the surface. This sequencing may be controlled from the surface via control system 145.

Figure 2A:
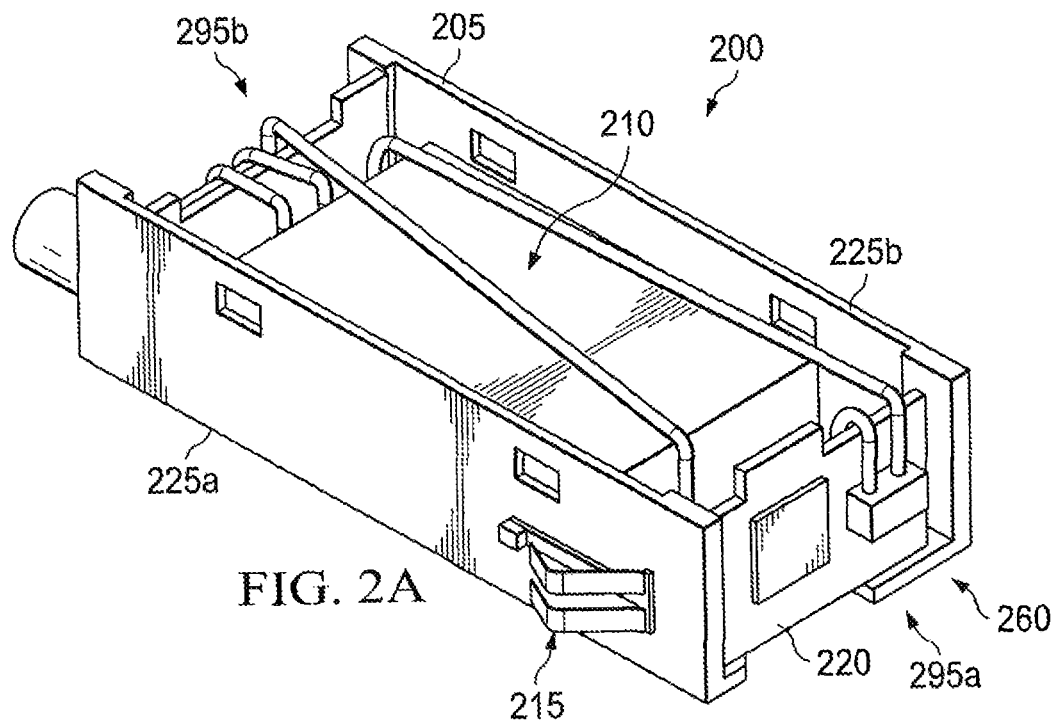
FIG. 2A is an example perspective view of a detonator module as viewed in part from the downhole side, according to principles of the present disclosure.

FIG. 2A is an example perspective view of a detonator module 200 as viewed in part from the downhole side 260, according to principles of the present disclosure. The detonator module 200 may comprise a housing having two opposing sides 225a, 225b and two opposing ends 295a, 295b which may be referred to as the downhole end 295a and uphole end 295b respectively generally with regard to which direction each electrical pad communicates (uphole to communicate with at least one uphole assembly or control system, or downhole to communicate with any downhole assembly in the wellbore), which may also go along with the intended physical orientation and/or positioning of respective electrical pads when the housing with include electrical pads are disposed within the wellbore. In a preferred embodiment, the uphole end would be uphole of the downhole end when the housing is in the borehole. The housing may be constructed from a plastic or a composite type material 205. The opposing ends 295a, 295b may be accessible to gain access to electrical or connection components. The opposing ends 295a, 295b each may be closed by removable covers 296b, 296c (FIG. 6) to protect the wiring and internal components while in use. A switch compartment 286 (FIG. 5B) is formed between sides 225a, 225b and opposing ends 295a, 295b that is of sufficient size to accept therewithin different types and sizes of addressable switches 210 currently available on the market. A downhole printed circuit board (PCB) assembly 220 is located at the downhole end 295a permitting easy wiring of downhole connectivity of the detonator module 200 with the addressable switch 210. A grounding element 215 is positioned to provide a ground path for electrical connections of the switch 210 and one or more of the PCB assemblies described herein. Moreover, the grounding element 215 is positioned on or through side 225a of the detonator module 200 and has a tensioning characteristic to apply a secure contact with a metal surface portion 305 (FIG. 7) of perforating gun 101, once installed within the perforating gun 101.

Figure 2B:
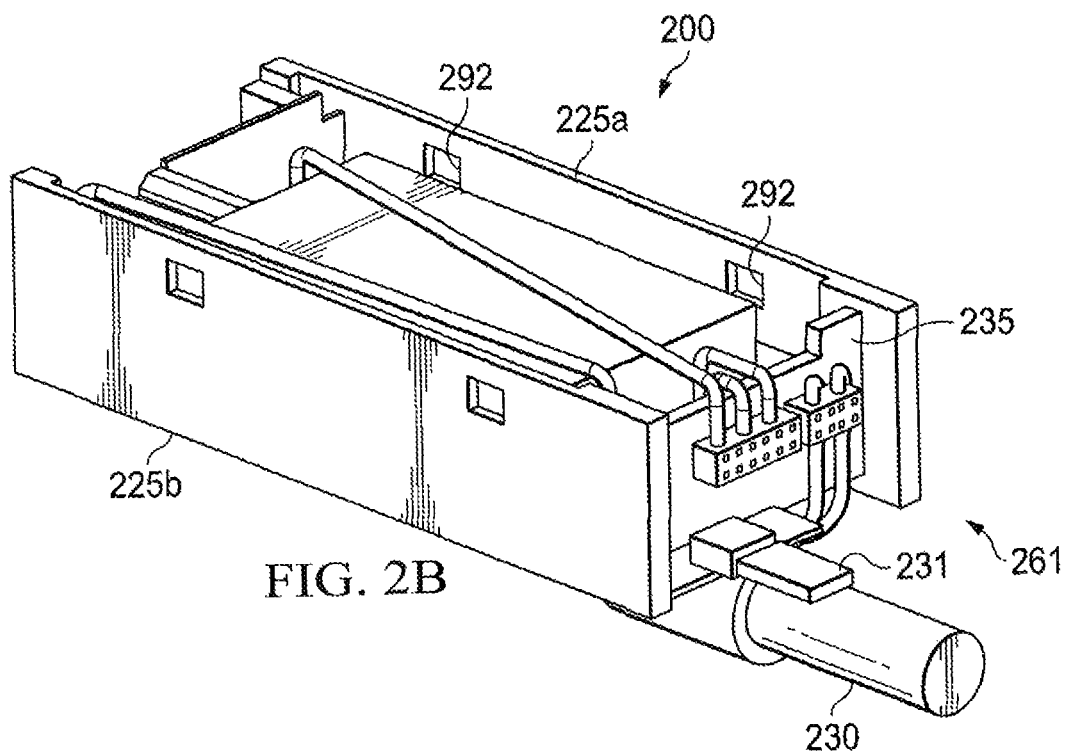
FIG. 2B is an example perspective view of the detonator module of FIG. 2A, as viewed in part from the uphole side, according to principles of the present disclosure.

FIG. 2B is an example perspective view of the detonator module of FIG. 2A, as viewed in part from the uphole perspective 261, according to principles of the present disclosure. The uphole end 295b includes a PCB assembly 235 for connecting wiring from the switch 210 to the detonator 230. Also shown are tab receivers 292 on both sides 225a and 225b of detonator module 200 that will accept corresponding tabs 293 from cover 296a (FIG. 6) for enclosing the detonator module 200.

Figure 2C:
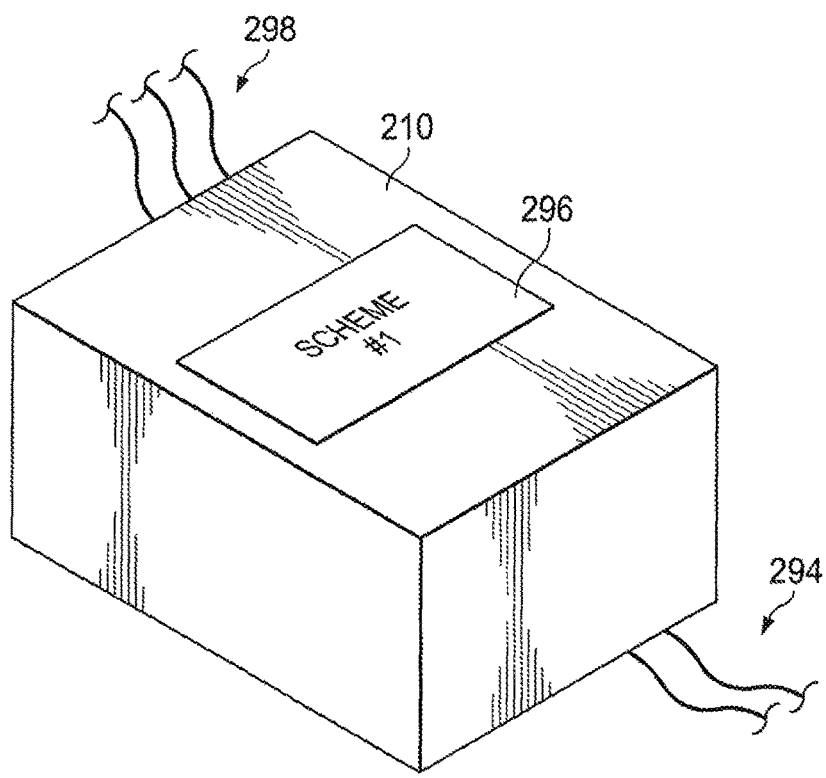
FIG. 2C is an illustration of an example of a first addressable switch 210.
Figure 2D:
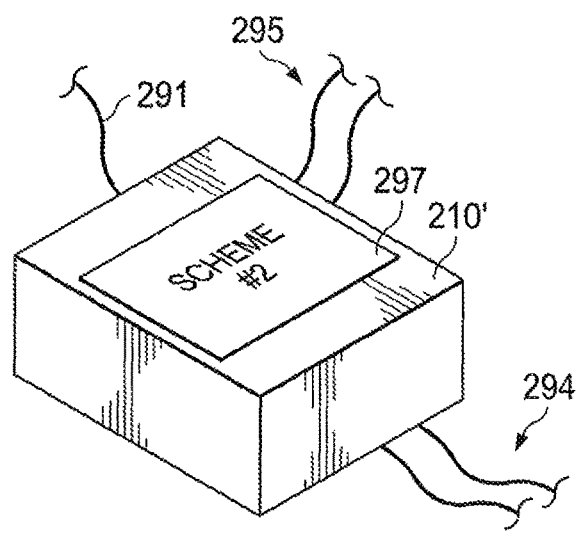
FIG. 2D is an example of a second addressable switch.

FIG. 2C is an illustration of a first example addressable switch 210, and FIG. 2D is a second example of another addressable switch 210, each configured according to principles of the disclosure. Switch 210 of FIG. 2C is shown with a particular physical size that is larger in at least one dimension (width, height or thickness) than the physical size of switch 210' of FIG. 2D. Moreover, the wiring arrangement 291, 294, 295, 298 (e.g., power-in, power to detonator, ground to detonator, communication in, and power out) is arranged in a different fashion as compared with switch 210' of FIG. 2D. For example, wiring arrangement may be oriented at least in part on different sides of switch 210 as compared with switch 210'. Furthermore, a different communication schema is shown between 210 and 210'. FIG. 2C shows that switch 210 uses a first communication schema 296, while switch 210' of FIG. 2D uses a second communications schema 297. For example, the communication differences may be associated with a communications protocol and/or power employed by the different manufactures of the switches 210 and 210'. Detonator module 200 can accommodate differences in switch types, although a single common communications schema would typically be necessary for all switches 210 employed in a particular completion project. Although, in some applications, different communications schemas might be sufficiently compatible to be usable together, as long as there is no interference with one another.

Figure 2E:
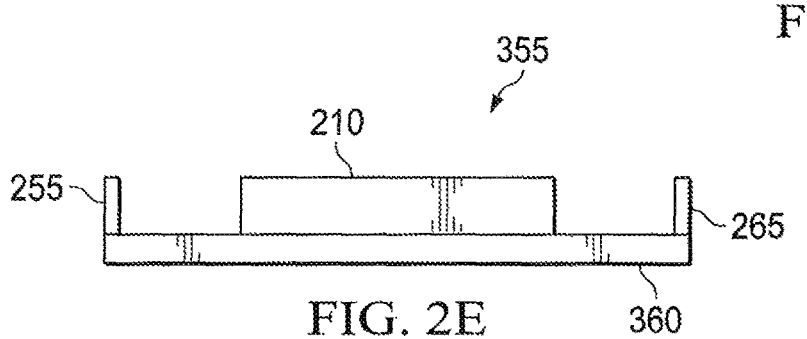
FIG. 2E is an embodiment of a single PCB and example addressable switch for use in a detonator module, according to principles of the disclosure.

FIG. 2E is an embodiment of a single PCB assembly 355 for use in a detonator module 200, according to principles of the disclosure. Using a single PCB 360 is an alternative to using a plurality of PCBs and provides a single PCB solution for adapting wiring connections of addressable switch 210 for use in a detonator module 200. The PCB assembly 355 includes all of the electrical and connectivity functionality of PCBs 220 and 235 as described herein below, including safety shunt. First communication pad 255 is shown positioned at the uphole end of the PCB 360. Second communication pad 265 is positioned on the PCB 360 for providing a contact location for an electric connection to downhole assemblies, as described more below. The single PCB 360 can be employed within detonator module 200 while allowing for sufficient space for compartment 286 (FIG. 5B) to accept an addressable switch 210 therewithin.

Figure 3:
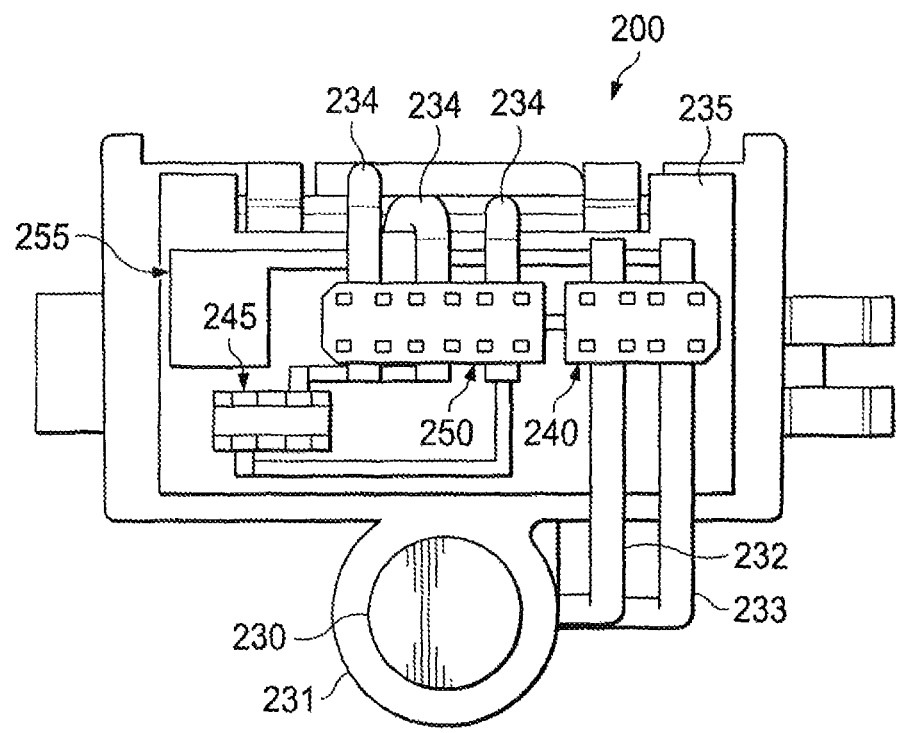
FIG. 3 is an example end-on view of the uphole side of the detonator module of FIG. 2A with a wire cover removed, according to principles of the present disclosure.

FIG. 3 is an example end-on view of the uphole side of the detonator module 200 of FIG. 2A with wire cover removed, according to principles of the present disclosure. The PCB 235 adapts wiring from addressable switch 210 to a detonator 230 and also adapts addressable switch 210 wiring for communications with uphole assemblies or surface equipment, as required by configuration of a particular perforating gun 101. PCB 235 includes a first wire-to-board connection 250 for the switch 210 including power-in, power-out and ground-to-detonator, denoted generally by reference numerals 234. The PCB 235 adapts wiring of the second wire-to-board connection 240 providing connections for detonator power and ground. A removable shunt 245 provides a safety feature to prevent an inadvertent detonation signal from reaching the detonator. This removable shunt 245 is attached during wiring of an addressable switch 210 with a detonator module and associated PCBs, and before any detonator is actually installed. This wiring is typically performed, but not necessarily, at a location different from a particular completion project, and may be shipped to the completion project. The removable shunt 245 on PCB 235 prevents inadvertent detonation, such as due to radio frequency (RF) signals or electrostatic discharge (ESD) during transit or during handling. This removable shunt 245 is removed, typically on-site, prior to insertion of the detonator module 200 into a perforating gun 101 and before lowering of the perforating gun 101 into a wellbore 105.

A first communication pad 255 is positioned on PCB 235 to provide a contact for an uphole assembly, once the detonator module 200 is installed in a perforating gun 101. This first communication pad 255 permits an external contact element, such as a pin 310 (FIG. 7), within a perforating gun to make a connection with uphole assemblies including control system 145 for communications and power. A detonator receptacle 231 is shown holding a detonator 230 in place. Power 232 and ground 233 wires are shown connecting the detonator 231 with the second wire-to-board connection 240 thereby providing necessary electric paths for the addressable switch 210 to initiate detonation of the detonator 230 upon a signal received from the surface 140. The detonator 230 in turn causes the shaped charges 126 associated with a particular perforating gun 101 and associated with the addressed switch 201 to detonate.

Figure 4:
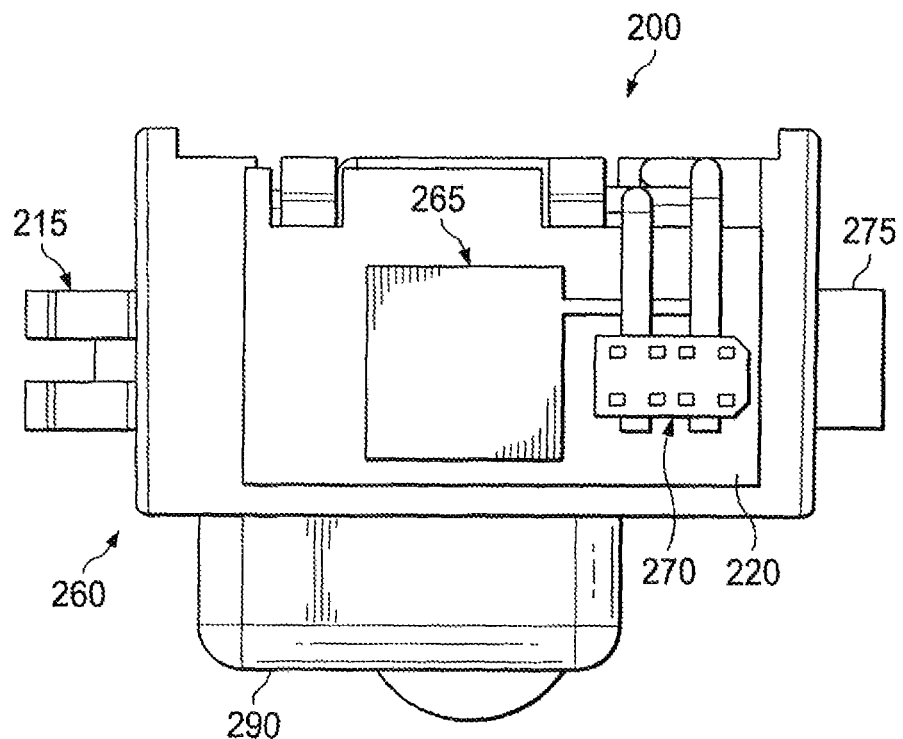
FIG. 4 is an example end-on view of the downhole side of the detonator of FIG. 2A with a wire cover removed, according to principles of the present disclosure.

FIG. 4 is an example end-on view of the downhole side of the detonator module 200 of FIG. 2A with wire cover 295a (FIG. 6) removed, according to principles of the present disclosure. PCB 220 includes a wire-to-board connection 270 to provide power out and ground connections. A second communication pad 265 is positioned on PCB 270 for providing a contact location for an electric connection to downhole assemblies, such as more perforating guns that may be positioned downhole. This downhole connection engaging second communication pad 265 may be a pin 315 (FIG. 7) that provides electrical connections downhole. A ground element 215 is shown that provides a grounding connection to the perforating gun 101, once the detonator module 200 is installed in a perforating gun 101. In FIG. 4, a retaining tab 275 is shown located outwardly from side 225b. The retaining tab holds the detonator module 200 into a compartment or chamber within a perforating gun 101, once the detonator module 200 is assembled, wired, and installed in the perforating gun 101. A removable cover 290 is shown installed to cover a lower portion of the detonator module 200.

Figure 5A:
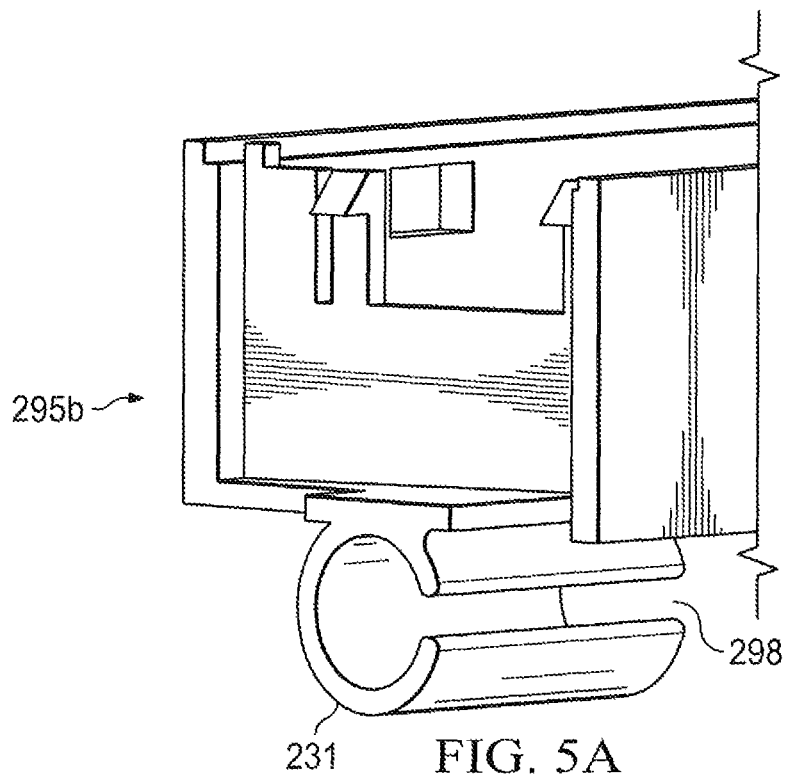
FIG. 5A is an example perspective view of a wire cover, with a retaining element for a detonator, connectable to the uphole end of the switch module of FIG. 5B, according to principles of the present disclosure.
Figure 5B:
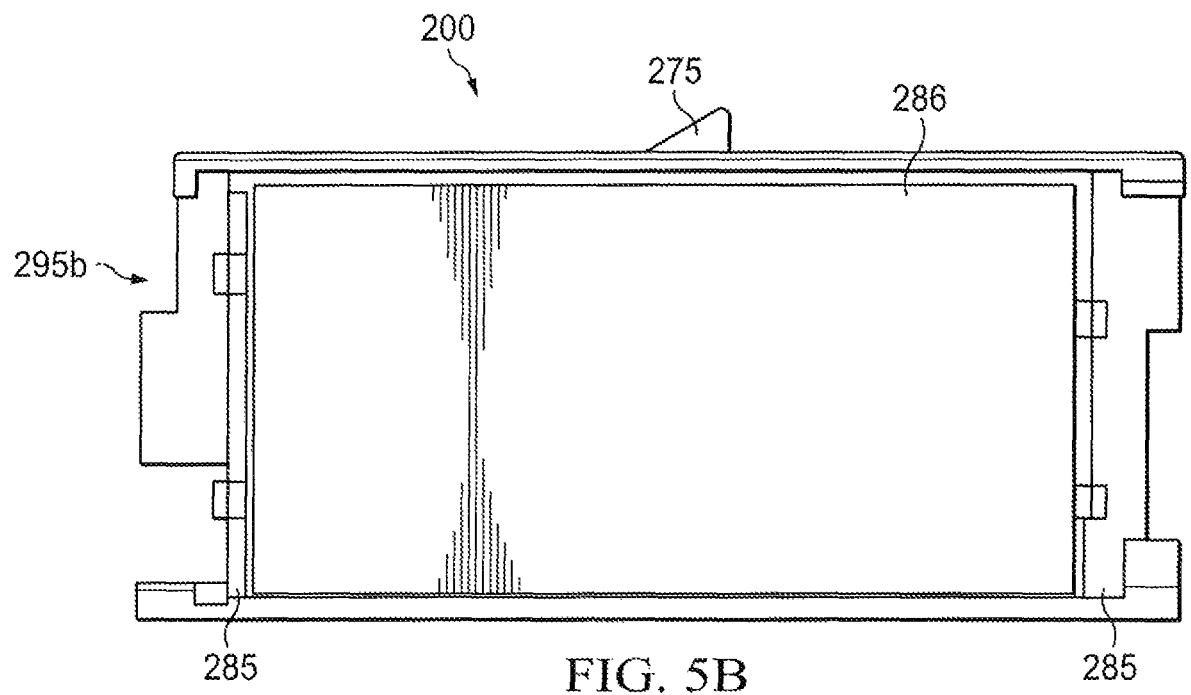
FIG. 5B is a top view of a switch module of FIG. 2A, without an addressable switch installed therewithin, according to principles of the present disclosure.

FIG. 5A is an example perspective view of an uphole end 295b of a detonator module 200 of FIG. 5B, according to principles of the present disclosure. Retaining receptacle 231 is sized and oriented to receive a detonator 230 therewithin. Retaining receptacle 231 may be a tube-like structure constructed to expand somewhat to hold a detonator 230 therewithin by friction fit. Retaining receptacle 231 may have a slit 298 oriented axially along a length of the tube-like structure which flexes to receive the detonator 230 therewithin, and holding the detonator 230 firmly.

FIG. 5B is a top view of a detonator module 200 of FIG. 2A, without a switch installed therewithin, according to principles of the present disclosure. A hollow switch compartment 286 is formed between sides 225a, 225b and opposing ends 295a, 295b that is of sufficient size to accept therewithin different types and sizes of addressable switches 210 currently available on the market. A retaining tab 275 is shown located outwardly from a side of the detonator module 200 for holding a detonator module 200 within a perforating gun 101, or within a collar 120 in some embodiments. Slots 285 are formed at each end 295a and 295b of the detonator module 200 that accepts removable wire covers 296b and 296c (FIG. 6) therewithin to protect wires and PCBs within the detonator module 200.

Figure 6:
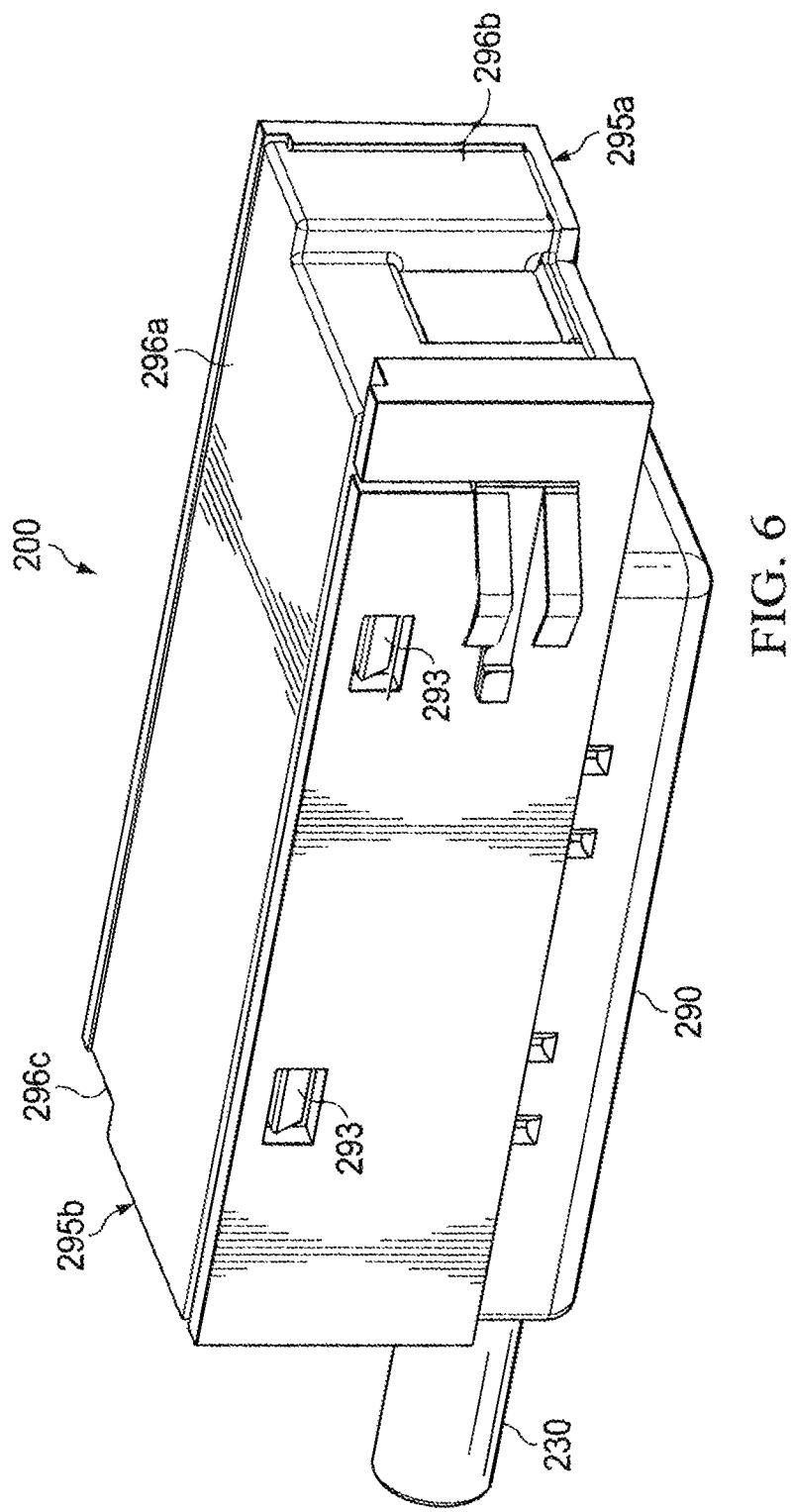
FIG. 6 is a perspective view of an assembled detonator module as viewed in part from the downhole side, according to principles of the present disclosure.

FIG. 6 is a perspective view of an assembled detonator module as viewed in part from the downhole side 260 at downhole end 295a, according to principles of the present disclosure. The assembled detonator module 200 is shown with protective covers 296a and 296b installed. Cover 296c is also installed, but not shown in FIG. 6 due to the view. A removable cover 290 is shown installed to cover a lower portion of the detonator module 200. Cover 296 is shown being held in place by tabs 293.

Figure 7:
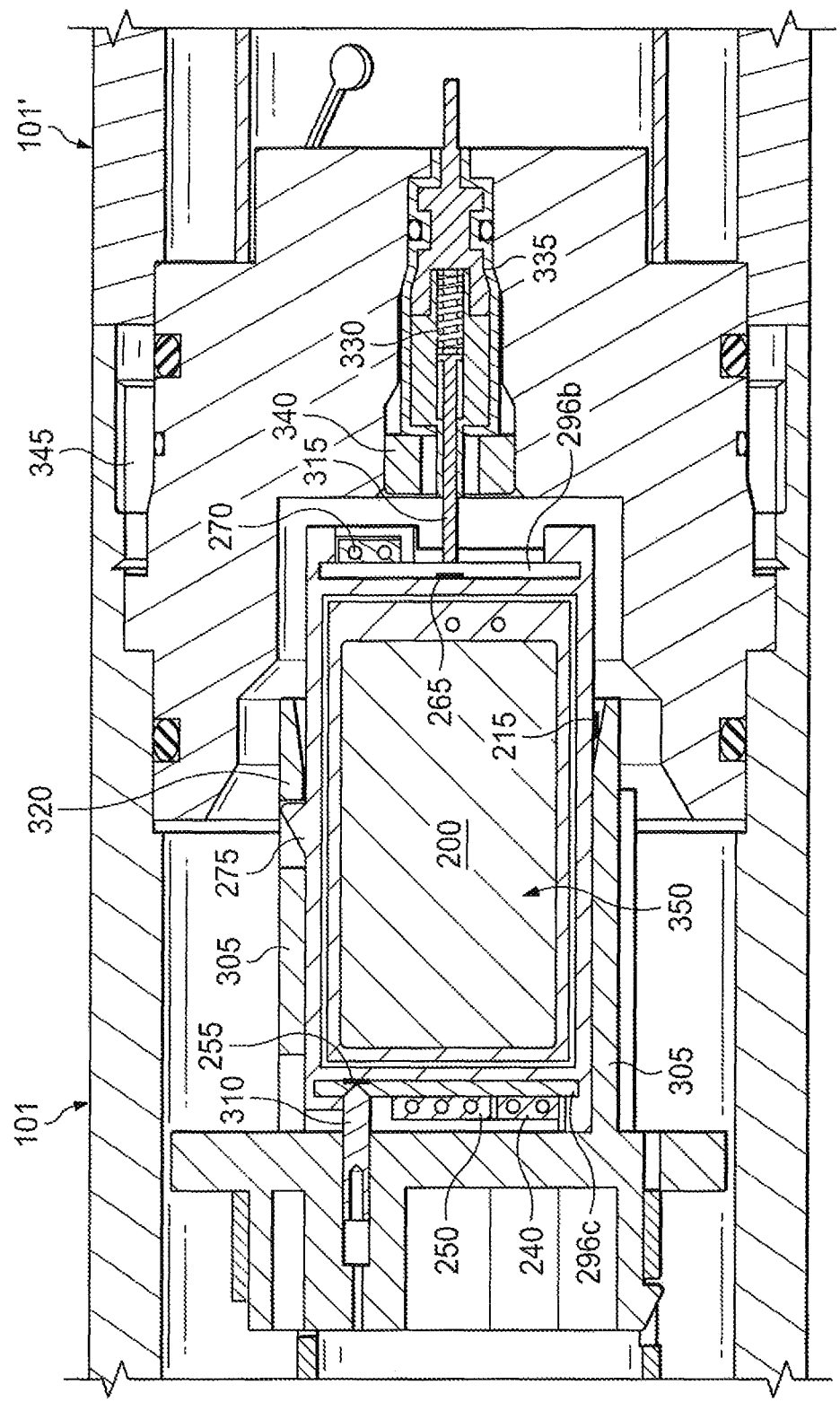
FIG. 7 is a cut-away illustration of an assembled detonator module installed in an example perforating gun, according to principles of the present disclosure.

FIG. 7 is a cut-away illustration of an assembled detonator module 200 installed in an example perforating gun 101, according to principles of the present disclosure. A perforating gun 101 is shown having an assembled detonator module 200 installed therewithin. When assembled detonator module 200 is installed, the detonator 230 is positioned proximate a detonator cord or "detcord" (not shown) that would be already present and positioned in the perforating gun 101. The detonator 231, when fired, ignites the detcord which causes detonation of shaped charges 126 in the perforating gun 101. Perforating gun 101 has configured therein a receiving compartment 350 defined between inner walls 305. The assembled detonator module 200 is typically inserted from right to left into the receiving compartment 350. A inner wall 305 of the perforating gun 101 has a holding feature 320 formed in inner wall 305, essentially a cut-out, that permits retaining tab 275 to "snap" into place to hold the assembled detonator module 200 within the perforating gun 101 while sliding the detonator module 200 into the compartment 350. Grounding element 215 is shown compressed and contacting inner wall 305 of the perforating gun 101 to establish an electrical ground path.

A pin 310 makes contact with the first communication pad 255 of the detonator module 200 to make a connection with any uphole assemblies including control system 145 for communications and power. Within an electrical feed-through bulkhead 335 that is held onto the perforating gun 101 by nut 340, pin 315 contacts pad 265 and provides electrical connections to any downhole assemblies that may be present, such as a second perforating gun 101', as shown. Perforating gun 101 may be connected to a second perforating gun 101' via threads 345, after the detonator module 200 has been inserted/installed into perforating gun 101. Pin 315 and/or pin 310 may be tensioned by spring 330 to assure a tight electrical connection. In embodiments, pin 310 and/or pin 315 make contact only by pressure contact with the respective communication pad 255 or 265. Perforating gun 101' may also be equipped with its own uniquely addressable switch.

By constructing a detonator module 200 to conform to the specific form factor of particular series of perforating guns, different types of addressable switches 200 selectable from among different manufacturers can be used. The switches can be pre-wired into the detonator modules prior to shipment, with safety shunts installed, so that nearly any type of available switch can be used in a well completion project. The ability to use nearly any available addressable switch on the market permits a greater degree of successful compliance with project specifications and quite often leads to improved cost performance. There may be different detonator modules 200 with differing height, width or thickness sizes or shapes so that they can be installed in a particular type of perforating gun; however, the ability to employ nearly any available addressable switch from among different vendors makes project compliance much easier and often reduces costs overall.

The detonator module may increase reliability at least in part by having the wiring of the addressable switch performed and completed by specialists apart from a job site, and not by personnel at a job site where job site constraints could intervene and make wiring of a traditional switch into a perforating gun more error-prone. The on-site personnel only have to insert the detonator module 200 into the perforating gun, after removing the safety shunt 245 to complete installation of an addressable switch into a perforating gun. In the past, on-site personnel would typically use a "blasting-tube" while wiring up an addressable switch to a detonator for a perforating gun. The "blasting-tube" is a safety feature to protect personnel from an errant detonator explosion while wiring a detonator and switch for a perforating gun. With the use of the detonator module, using a "blasting-tube" is no longer necessary.

In aspects, the principles of the disclosure include:

Clause 1: A detonator module, comprising:
  a housing defining a compartment to receive an addressable switch within the compartment;
  a first electrical pad positioned at an uphole end of the housing to communicate with at least one uphole assembly or control system; and
  a second electrical pad positioned at a downhole end of the housing for communicating with any downhole assembly in a wellbore.

Clause 2: The detonator module of clause 1, wherein the housing further comprises a detonator receptacle positioned at the uphole end of the housing for receiving a detonator therewithin.

Clause 3: The detonator module of clauses 1 or 2, wherein the housing includes therein a first printed circuit board (PCB) that adapts wiring of an addressable switch to a detonator.

Clause 4: The detonator module of clause 3, wherein the first PCB provides communication from at least one uphole assembly or control system to an addressable switch receivable within the compartment.

Clause 5: The detonator module of clauses 3 or 4, wherein the first PCB includes a removable safety shunt to prevent inadvertent detonation of a detonator due to radio frequency (RF) interference or electrostatic discharge.

Clause 6: The detonator module of any one of clauses 1-5, wherein the housing includes therein a second printed circuit board (PCB) that adapts wiring of an addressable switch receivable within the compartment to at least one down hole assembly for communication and power, the second PCB providing communication from a control system to the at least one down hole assembly.

Clause 7: The detonator module of any one of clauses 3-6, wherein the first PCB has an electrical contact pad formed on a surface of the first PCB for providing communication with the at least one uphole assembly or control system and an addressable switch receivable within the compartment.

Clause 8: The detonator module of any one of clauses 6 or 7, wherein the second PCB has an electrical contact pad formed on a surface of the second PCB for providing communication with any downhole assembly.

Clause 9: The detonator module of any one of clauses 1-8, further comprising:
  an addressable switch positioned within the compartment, wherein the detonator module is insertable into a perforating gun, without need for further wiring of the addressable switch with a preformatting gun.

Clause 10: An detonator module, comprising:
  a housing having an uphole end, a downhole end and two opposing sides disposed between the uphole end and the downhole end, the housing sized to be insertable within a perforating gun, the housing defining a compartment to accept an addressable switch therewithin, the addressable switch for controlling detonation of a perforating gun;
  a first printed circuit board (PCB) to electrically connect the addressable switch with uphole assemblies in a wellbore or to surface equipment;
  a second PCB to connect the addressable switch with downhole assemblies in a wellbore; and a grounding element located on the housing and connected to at least one of the first PCB and the second PCB, the detonator module insertable into a perforating gun, the grounding element contactable with the perforating gun.

Clause 11: The detonator module of clauses 10, wherein the first PCB comprises a wire-to-board connection for connecting an addressable switch with power-out, power to detonator and ground to detonator.

Clause 12: The detonator module of clauses 10 or 11, wherein the second PCB comprises a wire-to-board connection for connecting an addressable switch to power out and ground.

Clause 13: The detonator module of any one of clauses 10-12, wherein the first PCB includes a first communication pad to electrically connect by pressure contact with uphole assemblies for receiving power and communications.

Clause 14: The detonator module of any one of clauses 10-13, wherein the second PCB includes a second communication pad to electrically connect by pressure contact to downhole assemblies to pass communications and power.

Clause 15: The detonator module of any one of clauses 10-14, further comprising an addressable switch positioned within the compartment.

Clause 16: The detonator module of clause 15, wherein the addressable switch is selected from a group of different addressable switches, the group of addressable switches including at least two addressable switches having different dimensions, at least two addressable switches having different manufacturers, at least two switches having different addressing schemas, at least two addressable switches having different shapes, at least two addressable switches having different wring orientations, or any combination thereof.

Clause 17: A method of providing a detonator module comprising:
providing a housing that defines a compartment to receive an addressable switch within the compartment;
positioning at least one printed circuit board (PCB) having a first electrical pad thereon at an uphole end of the housing to communicate with at least one uphole assembly or a control system, and the at least one PCB having a second electrical pad thereon at a downhole end of the housing for communicating with any downhole assembly, the first electrical pad passing communications from the at least one uphole assembly or a control system to the second electrical pad.

Clause 18: The method of claim 17, wherein the at least one PCB comprises at least two PCBs and the housing further comprises a detonator receptacle positioned at the uphole end of the housing for receiving a detonator therewithin for causing detonation of shaped charges within a perforating gun.

Clause 19: The method of clauses 17 or 18, wherein the at least one PCB includes a removable safety shunt to prevent inadvertent detonation of a detonator due to radio frequency (RF) interference or electrostatic discharge.

Clause 20: The method of any one of clauses 17-19, further comprising inserting the detonator module into a perforating gun.

The examples set forth herein are merely illustrative and do not limit the scope of the disclosure. It will be appreciated that many other modifications and improvements to the disclosure herein may be made without departing from the scope of the disclosure.

I claim:

1. A detonator module, comprising:
a housing defining a compartment to receive an addressable switch within the compartment; wherein the housing includes therein a printed circuit board (PCB) that adapts wiring of an addressable switch to a detonator; wherein the PCB provides communication from at least one uphole assembly or control system to an addressable switch receivable within the compartment;
a first electrical pad positioned at an uphole end of the housing to communicate with at least one uphole assembly or control system;
a second electrical pad positioned at a downhole end of the housing for communicating with any downhole assembly in a wellbore; and
a grounding element located on the housing and connected to the PCB, the detonator module insertable into a perforating gun, the grounding element contactable with the perforating gun.

2. The detonator module of claim 1, wherein the housing further comprises a detonator receptacle positioned at the uphole end of the housing for receiving a detonator therewithin.

3. The detonator module of claim 1, wherein the PCB includes a removable safety shunt to prevent inadvertent detonation of a detonator due to radio frequency (RF) interference or electrostatic discharge.

4. The detonator module of claim 1, wherein the housing includes therein a second printed circuit board (PCB) that adapts wiring of an addressable switch receivable within the compartment to at least one down hole assembly for communication and power, the second PCB providing communication from a control system to the at least one down hole assembly.

5. The detonator module of claim 4, wherein the second PCB has an electrical contact pad formed on a surface of the second PCB for providing communication with any downhole assembly.

6. The detonator module of claim 1, wherein the PCB has an electrical contact pad formed on a surface of the PCB for providing communication with the at least one uphole assembly or control system and an addressable switch receivable within the compartment.

7. The detonator module of claim 1, further comprising:
an addressable switch positioned within the compartment, wherein the detonator module is insertable into a perforating gun without need for further wiring of the addressable switch switch with a preformatting gun.

8. A detonator module, comprising:
a housing having an uphole end, a downhole end and two opposing sides disposed between the uphole end and the downhole end, the housing sized to be insertable within a perforating gun, the housing defining a compartment to accept an addressable switch therewithin, the addressable switch for controlling detonation of a perforating gun;
a first printed circuit board (PCB) to electrically connect the addressable switch with uphole assemblies in a wellbore or to surface equipment;
a second PCB to connect the addressable switch with downhole assemblies in a wellbore; and
a grounding element located on the housing and connected to at least one of the first PCB and the second PCB, the detonator module insertable into a perforating gun, the grounding element contactable with the perforating gun.

9. The detonator module of claim 8, wherein the first PCB comprises a wire-to-board connection for connecting an addressable switch with power-out, power to detonator and ground to detonator.

10. The detonator module of claim 8, wherein the second PCB comprises a wire-to-board connection for connecting an addressable switch to power out and ground.

11. The detonator module of claim 8, wherein the first PCB includes a first communication pad to electrically connect by pressure contact with uphole assemblies for receiving power and communications.

12. The detonator module of claim 8, wherein the second PCB includes a second communication pad to electrically connect by pressure contact to downhole assemblies to pass communications and power.

13. The detonator module of claim 8, further comprising an addressable switch positioned within the compartment.

14. The detonator module of claim 13, wherein the addressable switch is selected from a group of different addressable switches, the group of addressable switches including at least two addressable switches having different dimensions, at least two addressable switches having different manufacturers, at least two switches having different addressing schemas, at least two addressable switches having different shapes, at least two addressable switches having different wring orientations, or any combination thereof.

15. A method of providing a detonator module comprising:
   providing a housing that defines a compartment to receive an addressable switch within the compartment; and
   positioning at least one printed circuit board (PCB) having a first electrical pad thereon at an uphole end of the housing to communicate with at least one uphole assembly or a control system, and the at least one PCB having a second electrical pad thereon at a downhole end of the housing for communicating with any downhole assembly, the first electrical pad passing communications from the at least one uphole assembly or a control system to the second electrical pad; and
   a grounding element located on the housing and connected to the PCB, the detonator module insertable into a perforating gun, the grounding element contactable with the perforating gun.

16. The method of claim 15, wherein the PCB comprises at least two PCBs and the housing further comprises a detonator receptacle positioned at the uphole end of the housing for receiving a detonator therewithin for causing detonation of shaped charges within a perforating gun.

17. The method of claim 15, wherein the PCB includes a removable safety shunt to prevent inadvertent detonation of a detonator due to radio frequency (RF) interference or electrostatic discharge.

18. The method of claim 15, further comprising inserting the detonator module into a perforating gun.

19. The method of claim 15, wherein the PCB comprises a wire-to-board connection for connecting the addressable switch with power-out, power to detonator and ground to detonator.

20. The method of claim 15, wherein the addressable switch is selected from a group of different addressable switches, the group of addressable switches including at least two addressable switches having different dimensions, at least two addressable switches having different manufacturers, at least two switches having different addressing schemas, at least two addressable switches having different shapes, at least two addressable switches having different wring orientations, or any combination thereof.

* * * * *